United States Patent [19]
Chaudhari et al.

[11] 4,012,756
[45] Mar. 15, 1977

[54] METHOD OF INHIBITING HILLOCK FORMATION IN FILMS AND FILM THEREBY AND MULTILAYER STRUCTURE THEREWITH

[75] Inventors: Praveen Chaudhari; François M. d'Heurle; Amitava Gangulee, all of Ossining, N.Y.

[73] Assignee: International Business Machines Corporation, Armonk, N.Y.

[22] Filed: Jan. 27, 1975

[21] Appl. No.: 544,462

Related U.S. Application Data

[63] Continuation of Ser. No. 889,100, Dec. 30, 1969, abandoned.

[52] U.S. Cl. .................................. 357/5; 357/4; 357/6; 307/306
[51] Int. Cl.² ....................................... H01L 27/12
[58] Field of Search ............... 357/5, 4, 6; 307/306

[56] References Cited

UNITED STATES PATENTS

| | | | |
|---|---|---|---|
| 3,689,780 | 9/1972 | Meissner | 307/306 |
| 3,733,526 | 5/1973 | Anacker | 317/234 R |
| 3,816,173 | 6/1974 | Eldridge | 117/217 |

OTHER PUBLICATIONS

Lumpkin, I.B.M. Tech. Discl. Bull., vol. 10, No. 5, Oct., 1967, p. 679.
Leder, Cryogenics, Dec., 1968, pp. 364–371.
Adler et al., Canadian Journal of Physics, vol. 43 (Apr., 1965).

*Primary Examiner*—Martin H. Edlow
*Attorney, Agent, or Firm*—Bernard N. Wiener

[57] ABSTRACT

In accordance with the disclosure, certain impurities, e.g., alloying additions, are introduced in thin metal film to negate the driving force or the effect of the driving force which causes the hillock formation. Such thin metallic films are usually fabricated on the substrates which have different thermal coefficients of expansion than the film itself, and during thermal cycling stresses can be introduced into the film. This stress may serve as a driving force for atom movement and, therefore, to the formation of hillocks. The vehicle by which the induced stress in a film effects the requisite atom movement is via defect movement, and when the force is compressive this gives rise to hillocks. In the practice of this disclosure, impurity additions introduced into a film affect hillock growth by their interaction with the defects which give rise to the requisite atom movement. Systematically selected impurity additions are introduced into a film during fabrication thereof which inhibit the defect movement in the class consisting of a migration of point defects, linear defects and planar defects wherein the linear defects are dislocations and the planar defects are grain boundaries. Usually, the addition of impurities into a metal film is termed alloying and the resultant film is termed an alloyed film. The alloying addition may be either soluble or insoluble in the film. This will determine the choice of possible modes of fabrication. When the alloy addition is soluble, it is included within the limits of solubility at the temperature at which it is introduced. When the alloy addition is insoluble, it is introduced during fabrication and quantity thereof may be significantly better than the quantity capable of being sustained were the alloying addition and the film to be in thermal equilibrium.

7 Claims, 13 Drawing Figures

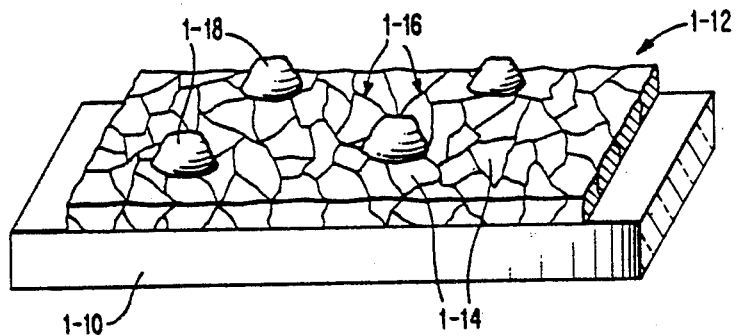
FIG. 1A
FIG. 2
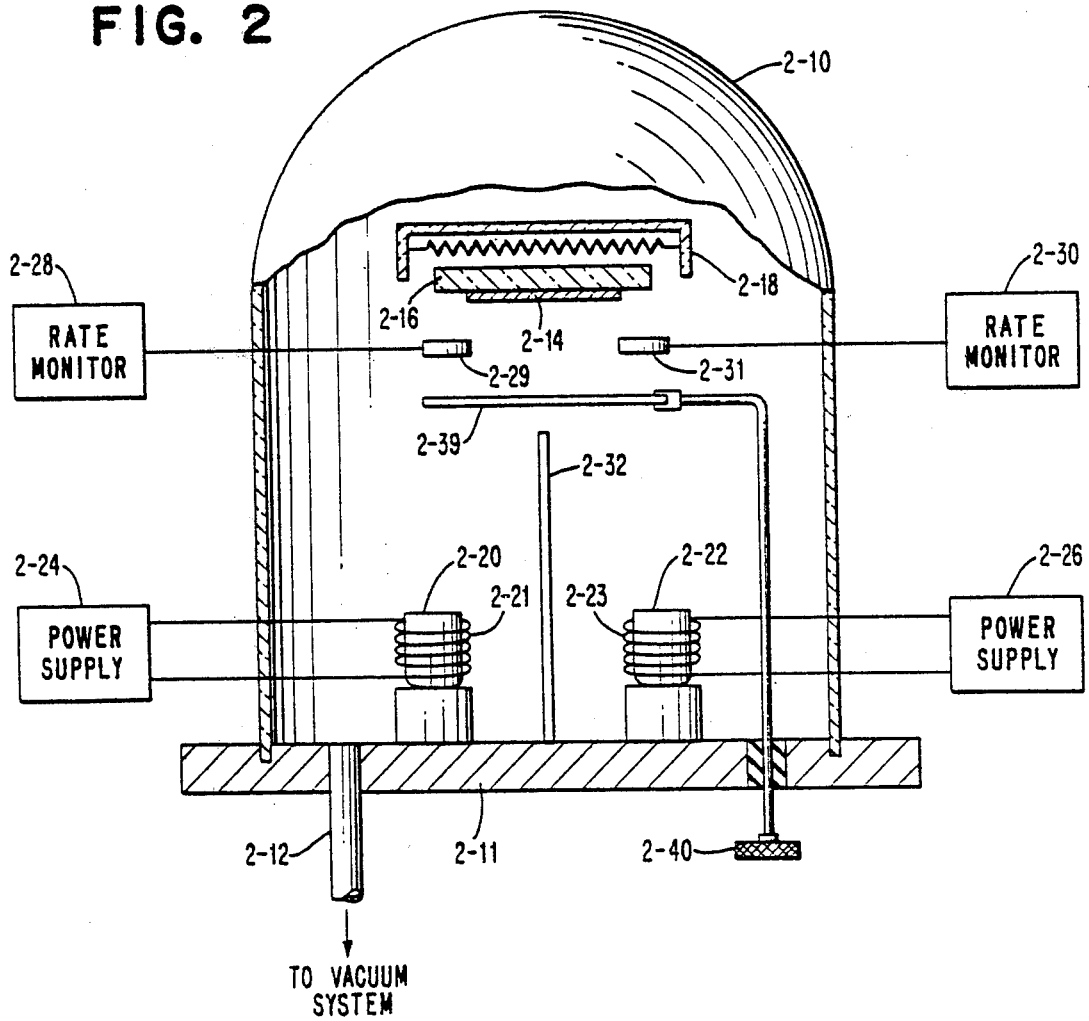

METHOD OF INHIBITING HILLOCK FORMATION IN FILMS AND FILM THEREBY AND MULTILAYER STRUCTURE THEREWITH

This is a continuation, of application Ser. No. 889,100 filed Dec. 30, 1969 now abandoned.

BACKGROUND OF THE INVENTION

Briefly, protrusions commonly termed hillocks are known to develop on the surface of thin metallic films which are subjected to thermal cycling between certain temperature extremes. Such thermal cycling is often either necessary for fabrication of the thin films or the structure of which it forms a part, or during operation of the film or structure in its intended use, or during excursion from storage temperature or from use temperature. The protrusions or hillocks are detrimental to fabrication of devices using such films and to the devices once fabricated usually because there are associated with the thin metallic films thin and fragile layers, for example, insulating layers, which are damaged by the development or growth of the hillocks; also, hillocks can affect the intrinsic device properties of a single film, for example, in magnetic devices For greater detail, a thin film which is deposited on a substrate is stressed because of differential thermal expansion of the film and the substrate. In most metal and substrate composite structures the metal has a larger coefficient of thermal expansion than that of the substrate and as a result biaxial compressive stress is set up in the metal film when the film and substrate composite is heated from one temperature to a higher one. One of the ways in which a film tends to relieve the induced compressive stress is by a growth of small protrusions or hillocks on the film surface.

The presence of hillocks on the surface of a thin metallic film has been detrimental to both the fabrication of a film itself and to devices in which it is introduced. In many multilayer devices utilizing a thin metallic film there are present thin and fragile insulator (or protective) layers which are either impaired or effectively destroyed by hillock formation on the metal film during fabrication or use of the device.

In the prior art thin metallic films are known in which alloying additions are incorporated for several metallurgical purposes. Illustratively, copending patent application Ser. No. 791,371 and commonly assigned utilizes copper additions in thin Al conductive films to impart resistance to the film against damage consequent from current induced transport phenomena, e.g., electromigration; and U.S. Pat. No. 3,427,154 issued Feb. 11, 1969, disclosed a procedure for obtaining amorphous alloys in film form wherein codeposition of the components obtains an amorphous film which is metastable to relatively high temperature. However, the prior art is not known to have provided sufficient understanding of the mechanisms by which hillock formation produced on the surface of metallic film to have alleviated generally the troublesome difficulty for fabrication of films and associated devices wherein hillock growths have detrimental consequences.

Included among the types of multilayer devices which are detrimentally affected by hillock formation on metallic films therein are magnetic film devices, superconductor tunneling devices, and semiconducting devices, particularly those with multilevel interconnections. In the magnetic type of device, conductive metal film is separated from magnetic film by an insulating layer; and thermal cycling during fabrication of the structure with consequent hillock formation causes detrimental shorts between the conductive layer and the magnetic layer. In the tunneling devices a superconductive film on a substrate is separated from another superconductive film by an insulating layer and the operation of the device is dependent upon the structural integrity of the insulating layer which is detrimentally impaired by hillock formation on the interface surface between the one film established on the substrate for the device and the insulating layer. In the semiconducting devices, the device is often protected by a glass layer which can be ruptured by hillock formation on the underlying metal conducting films; and, in the case of multilevel interconnection integrated circuits, hillocks may cause electrical shorts between superposed metallic conducting layers.

More particularly, thin film tunneling devices are described in the illustrative literature references of: "The Tunneling Cryotron — A Superconductive Logic Element Based on Electron Tunneling," by J. Matisoo, appearing in *Proceedings of IEEE*, Vol. 55, No. 2, February 1967 at pages 172–180. This same article also described a Josephson current device which operates on the principle discussed by B. D. Josephson in *Phys. Letters*, Vol. 1, pages 251–253, July 1962 — "Possible New Effects in Superconducting Tunneling".

Conventional thin film tunneling devices have numerous problems associated with them. One of the most troublesome of these results from thermal cycling between a low temperature state and room temperature. This cycling may cause stress induced structural changes of electrode material resulting in hillock formation, across the tunnel junction, and thus a short circuit. This problem is especially acute with materials, such as lead, tin, and indium, and other low melting point mmetals when cycled between a superconductive temperature and room temperature. Such cycling of temperature occurs when leads are being deposited on the devices or when there is a failure of the refrigeration system which is used to create an operating environment for the devices. Cycling also occurs when the devices are being stored between usage or are being repaired. In Josephson type devices, where the tunnel barrier is of such small thickness, i.e., 2–20A, the recrystallization problem becomes extremely sensitive, since arrays of these devices are destroyed if there is even minor structural changes in discrete devices in the array. Due to the thinness of the barrier, shorted junctions easily develop from almost any degree of hillock growth.

SUMMARY OF THE INVENTION

It is an object of this invention to provide a method for inhibiting hillock growth on a surface of a metallic film subjected to thermal cycling by including therein a distribution of impurities which interact with related defects in the film.

It is another object of this invention to provide a method for minimizing hillock growth on a surface of a metallic film subjected to thermal cycling by preferentially introducing therein a distribution of alloying addition which selectively reduces movement in the film of defects from at least one of the members of the class consisting of point defects, linear defects and planar defects.

It is another object of this invention to provide a method for precluding hillock growth at a surface of a metallic film subjected to thermal cycling by distributing preferentially therein alloying additions which effect binding energies with defects in the film which give rise to the hillock formation.

It is another object of this invention to distribute preferentially alloying additions in a metallic film subject to thermal cycling which gives rise to hillock formation on a surface of the film resultant from compressive stress in the film related to the thermal cycling.

It is another object of this invention to provide a metallic film resistant to hillock formation on a surface thereof wherein a selected alloying addition is preferentially distributed in the film to impede defect movement associated as a requisite for the hillock formation.

It is another object of this invention to provide a method for inhibiting hillock formation on a surface of the metallic film resultant from thermal cycling of the film between given extremes of temperature by selectively distributing in the film alloying additions having different characteristics which are specific to reducing defect movement of the character point defects, dislocations and grain boundaries through introducing such alloying additions in a manner to minimize hillock formation on the surface of the film by one or more of the characterized defects.

It is another object of this invention to provide a multi-layer structure wherein a conductive metal film is separated from another metal film by a thin insulating layer which would be detrimentally impaired because of hillock formation on the surface of either metal film during fabrication of the multi-layer structure by selectively introducing into at least one of the metal films a distribution of alloying addition which retards defect movement which gives rise to atom movement in the film resulting in hillock formation on the surface.

It is a further object of this invention to provide a film tunneling device wherein there is a current path via an insulator layer between two conductive metal films in which at least one of the metal films has a selective distribution of alloying additions which inhibits growth of hillocks on the surface of the one metal film adjacent to the insulator layer.

The practice of the invention improves the operation of devices involving multilayer technology which can fail due to protrusions or growths between the layers which result from thermal cycling of the device, either during its fabrication or during its operation or during excursions from storage temperature or use temperature. These growths cause either mechanical failure or electrical failure by shorting between current-conducting layers and other layers in the multilayer device. Such failures are minimized and the life-time of the multi-layer devices is enhanced by controlling defect movements in the layers by alloying additions selectively introduced with a preferential distribution and through large scale control of the microstructure of the layer. The defects which are controlled in the practice of this invention include point defects such as vacancies, linear defects, such as dislocations and planar defects such as grain boundaries. In certain cases, the growths are caused by movement of point defects along the grain boundaries. By decreasing the grain boundary diffusivity, the growth process becomes more difficult and the life-time of the device involved is thereby increased. In other cases, the growths occur by movement of linear defects i.e., dislocation or slip, and appropriate alloy additions introduced in accordance with the principals of this invention impede the dislocation movement and, therefore, increase the life-time of the device. The use of alloying additions to form second phase precipitates which hinder dislocation motion is termed dispersion hardening. In still other cases, alloying additions introduced in accordance with the principles of this invention control the grain size of the layer involved. This is particularly important for devices where dislocation movement accounts for atomic movement more than diffusion does. Illustratively, specific examples for inhibiting growths due to thermal cycling in Al films include the alloy additions of Be, Cu, Mg, Si and Th; and growths are inhibited on Pb films by alloying additions of Al, Ag, As, Sn, Sb and Si. It is within the principles of this invention that in practice more than one alloying addition may be included in a metal layer to inhibit hillock growth.

BRIEF DESCRIPTION OF THE DRAWINGS

FIG. 1A depicts an idealized perspective of the metallurgy structure of a metallic film and illustrates the believed appearance of hillock formation on the surface thereof due to thermal cycling between temperature extremes.

FIG. 2 is a schematic diagram of an evaporation system whereby a film in accordance with this invention, is deposited on a substrate.

PRINCIPLES OF THE INVENTION

FIG. 1A is an idealized rendition of a portion of a thin film which has undergone the proces of hillock growth or formation as a result of compressive stresses generated by thermal cycling. A typical thin film 1–12 is deposited on the substrate 1–10. The film shown is polycrystalline, i.e., it has grains 1–14 joined at grain boundaries 1–16. Typical hillocks 1–18 on the film 1–12 are shown in FIG. 1A. The hillocks 1–18 grew because of the differential thermal expansion of the film 1–12 and substrate 1–10, which promoted atomic mass flow by defect movements in the film 1–12.

Figure 1B:
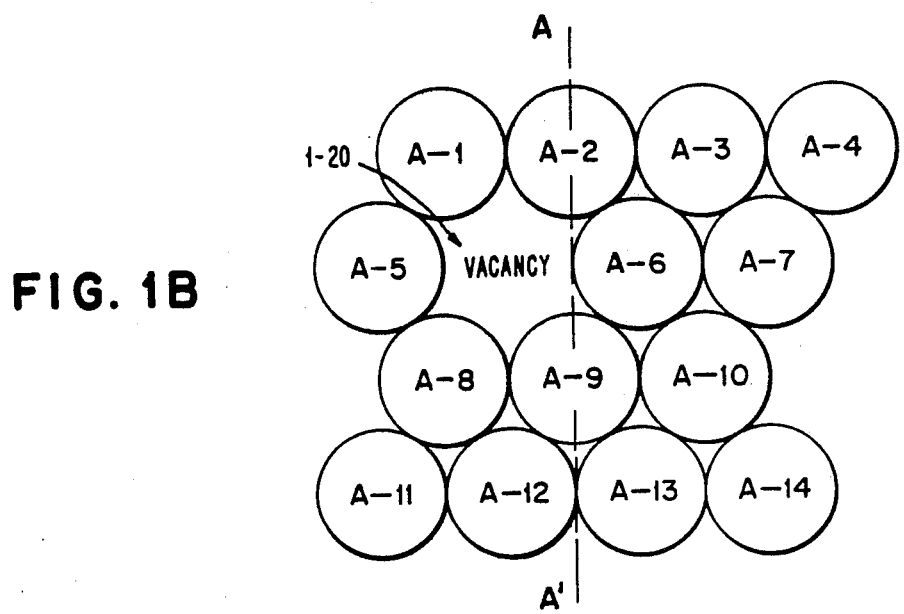
FIG. 1B is a schematic representation of a vacancy point defect in a crystal lattice.

FIG. 1B shows one type of point defects, namely, vacancies. The figure shows one vacancy 1–20 sitting among identical atoms A–1 to A–14. Both atom movements by means of vacancies and the effect of an impurity atom can be illustrated by this figure. For an imaginary line AA' across FIG. 1B, to the left of this line there is a vacancy whereas to the right of this line there are not any vacancies. For an atom to the right of this line, for example, the atom A–6, if the atom A–6 and the vacancy exchange their places, this can be considered as a net flow of one atom, namely, A–6 from the right of the line AA' to the left of the line AA'. This is an example of mass flow by vacancy movement. Further, for some atom adjacent to the vacancy, for example, atom A–8 is an impurity atom and further consider that the vacancy 1–20 is bound to the impurity atom A8. The exchange mechanism mentioned in the previous sentence is considerably more difficult to accomplish because in this case the vacancy would not disassociate from the impurity atom, namely, A–8, and therefore, both the vacancy and the impurity atom A–8 would have to be exchanged with atoms A–6 and A–9, respectively, to cause any mass flow. Obviously such exchange is considerably more difficult than moving a single vacancy. Therefore, a high binding energy between impurity atoms and vacancies will impede mass flow and as a result, decrease hillock growth.

Figure 1C:
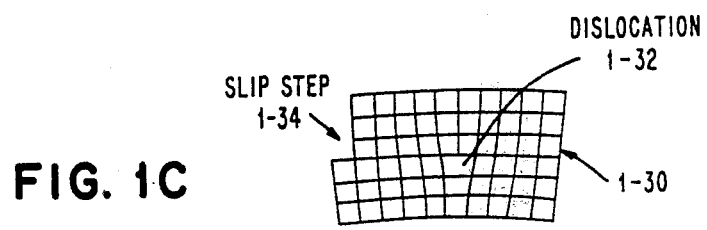
FIG. 1C is a schematic representation of the sectional view of a dislocation line defect in a crystal lattice.

FIG. 1C shows a typical line defect, namely, a dislocation. Illustratively, an edge dislocation 1–32 in an otherwise perfect crystal lattice 1–30, produces a slip step 1–34. Such a slip step on the surface can eventually cause failure in a device where even such small growth as slip steps could have disastrous effects. A typical example where a few slip steps can cause complete failure of the device is a superconducting tunnel diode where the barrier width varies from 2–20A units. The figure shows the dislocation in cross-section, i.e., the dislocation line comes out of the plane of the paper and goes into the plane of the paper. Since movement of the dislocation causes the slip steps, an impurity atom or precipitate right next to the dislocation can tie up the disclocation line and thereby prevent failure of the device.

Figure 1D:
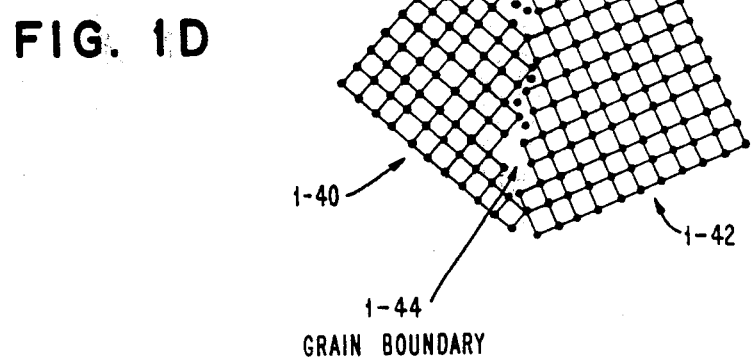
FIG. 1D is a schamtic representation of a sectional view of a grain boundary planar defect, namely, joining two grains.

FIG. 1D shows a grain boundary. Grains 1–40 and 1–42 are joined along the boundary 1–44. Since a grain boundary is a surface with irregular atomic structure, mass transfer through grain boundaries to the hillocks is relatively easier. Impurity atoms segregated to grain boundaries can make this mass transfer more difficult and thereby impede hillock growth. Furthermore, hillocks can also grow by relative movement of grains at the grain boundaries, e.g., grain 1–40 can move up on grain 1–42. Such relative movement occurs at the grain boundary 1–44. Impurity atoms, either singly or in the form of a precipitated second phase, can lock grain boundaries thereby preventing hillock growth.

FIG. 2 shows a schematic arrangement of a suitable apparatus for depositing doped films on a substrate. The whole system is enclosed in an evacuated bell jar 2–10 placed on bell 2–11 which is connected to a vacuum outlet 2–12. The substrate or substrates 2–14 are held in the substrate holder 2–16. A substrate heater 2–18 maintains the substrate at any predetermined temperature. The film material and the doping material are evaporated from separated crucibles 2–20 and 2–22 which are powered by separate power supplies 2–24 and 2–16 via windings 2–21 and 2–23, respectively. The rate of deposition is monitored by quartz crystal rate monitors 2–28 and 2–30, connected to quartz crystals 2–29 and 2–31, respectively. The beginning and end of a deposition run is controlled by the shutter 2–39 operated via knob 2–40 and the partition 2–32 prevents any undesirable contamination of the film material and the doping material.

Background literature which provides detailed information about evaporation units and thin film technology useful for the practice of this invention are:

a. "Thin-Film Components and Circuits" by N. Schwartz et al., PHYSICS OF THIN FILMS — Advances in Research and Development, Vol. 2, 1964 Academic Press, pages 363–425.

b. "Focused-Beam Electron Bombardment Evaporator" by D. H. Blackburn et al., THE REVIEW OF SCIENTIFIC INSTRUMENTS. Vol. 36, No. 7, July 1965, pages 901–903.

c. VACUUM DEPOSITION OF THIN-FILMS by L. Holland, John Wiley and Sons, Inc., 1960.

Compressive stress in a film leads to compressive strains inside a film. These strains can be eliminated or removed by transferring atoms from the inside onto the free surface of a film. The free surface is to be contrasted with the interface of the film to the substrate. The transfer of the atoms to the free surface of a film occurs by what is usually known as plastic flow in the film. There are three broad mechanisms of plastic flow in crystalline materials. These are: a vacancy mechanism called diffusion creep, a dislocation mechanism, and a grain boundary movement mechanism. If these mechanisms occur uniformly throughout the entire film and the transfer of material from within the film onto its free surface is homogeneously distributed, hillock formation is not observed. However, if plastic flow occurs at localized spots, that is, at selective areas, mass transfer onto the free surface gives rise to the formation of hillocks. The hillocks can, therefore, be avoided if plastic flow can either be made to occur homogeneously through the entire film or if plastic flow is prevented from occurring at all. Through the practice of this invention, plastic flow can be minimized in the films. This is accomplished by the selective addition of alloying elements to the film. These alloying elements tend to interact with defects which are vacancies, dislocations or grains boundaries and tend to pin them down so that their mobility is reduced or effectively eliminated. The criteria used in selecting such elements are described hereinafter.

A vacancy leads to mass flow by several mechanisms. The most simple mechanism is diffusion creep which involves the transfer of atoms by vacancies. Hillock formation by diffusion creep has been described by P. Chaudhari in the *IBM Journal of Research and Development*, Vol. 13, 1969, page 197 et seq. A vacancy is the absence of an atom at atomic site and is shown in FIG. 1B. Vacancy 1–20 is mobile in a crystal. It moves around and each time it moves it transfers to a neighboring atomic site and the corresponding atom thereat moves to the site that the vacancy previously occupied. Under an applied stress, the motion of the vacancy is directed in such a manner to lead to microscopic plastic flow. This type of plastic flow is called Nabarro-Herring creep. If vacancies can be slowed down by the addition of an alloying element, then diffusion creep can be minimized. There are a large number of prior art investigations which show that impurity atoms tend to interact with vacancies and slow them down. A paper which describes the theory of vacancy annealing in metals is by A. Damask and J. Dienes, published in the *PHYSICAL REVIEW*, Vol. 120, Oct, 1, 1960. Subsequent investigations have also confirmed the general view that certain impurity atoms tend to slow down the movement of vacancies. This slowing down occures because the impurity atom interacts with the vacancy and this interaction is usually described by an interaction energy or a binding energy. A recent paper illustrating this interaction is "Influence of Sn on the Ageing of Al-Zn 10% Alloy" by S. Ceresara et al in *Acta Metallurgica*, Vol. 17, 1969, page 225 et seq., disclosing that the binding energy of tin to a vacancy in aluminum zinc is about 0.31 electron volts. A more comprehensive treatment is presented by T. Federighi. He discusses the interaction of various impurities with vacancies in aluminum in the book, *Lattice Defects in Quenched Metals*, edited by Cotterill et al, Academic Press, 1965. The author shows that magnesium and copper along with tin and other elements tend to interact with vacancies in aluminum.

Illustratively, the theory of the relationship of dislocations to plastic flow is described in the book by J. Friedel "Dislocations," published by Pergamon Press, 1964. This book describes generally the theory of dislocations and their interactions with impurities. Such dislocations lead to plastic flow in films and give rise to local sites where slip, that is, movement of dislocations, leads to localize stress relaxation and this promotes hillock formatiom. Therefore, the obstruction to the motion of dislocation is one of the factors in hillock growth. The noted book by Friedel also describes how impurities and precipitates interact with dislocations.

Impurities interact with dislocations through the elastic stress field of a dislocation and the elastic stress field associated with impurity. Precipitates interact with dislocations through the elastic stress field and also by presenting a physical barrier to the motion of these dislocations. The barriers are harder than the matrix and can physically prevent dislocations from going through. This is true in the case of magnesium and copper in aluminum and in the case of silver in lead and also the case of gold in lead where the gold reacts with the lead locally to form a hard compound of the lead-gold alloy. This hard compound prevents the motion of dislocations through not only the strain introduced by the compound, but also by its hardness. Moreover, as indicated by P. Chaudhari in the article mentioned above, motion of a dislocation is a function of its length, and in fine grain materials dislocation motion is limited. However, it is rather difficult to control the grain size in films of pure materials. Alloying additions will inhibit dislocation motion by reducing the grain size in alloyed films. It is known that alloyed films have smaller grains than pure films.

Alloying additions selected in accordance with the principles of this invention can also reduce the commpressive stresses themseleves. Illustratively, for Pb films which are cooled to cryogenic temperature, compressive stresses occur during heating because the Pb films partially yielded plastically during cooling. by inhibit-dislocation movement, the alloying additions inhibit this yield phenomenon and the related compressive stresses.

Grain boundary movement occures by the movement of one grain relative to the other at their interface boundary. A grain boundary is shown in FIG. 1B by number 1-44. At high temperatures relative to the melting point in the material, for example, in lead and tin, this would correspond to room temperature and in Al this is approximately 200° C or higher. These gain boundaries are mobile, they are fluid like and will flow under a shear stress. The grains will move relative to each other under a shear stress. Such boundary movement leads to plastic flow. It is therefore necessary to pin these boundaries down, that is to provide obstruction to the movement of these boundaries. This obstruction can be provided by introducing precipitates at the boundary. The precipitates are hard relative to the matrix. Therefore, at temperatures where normally movement would have occurred boundaries containing precipitates are relatively immobile. These present physical barriers to the movement of boundaries.

A reference for the study of the properties of grain boundaries is the book by D. McLean entitled "Grain Boundaries in Metals," Oxford University Press, 1957. Calculations of the interaction of impurities with grain boundaries are presented there at pages 124–125. In general, one way of studying the mobility of grain boundaries has been by internal friction techniques. A particular internal friction phenomenon has been ascribed to the movement of grains with respect to one another at the grain boundaries. This is called the grain boundary internal friction peak. It is known that in metals, there are two internal friction peaks due to grain boundaries. One is characterized by a high activation energy which is equivalent to the activation energy for diffusion in the lattice; the other peak called the "low temperature grain boundary peak" is characterized by an activation energy which is equal to the activation energy for grain boundary diffusion. A description of these two internal friction peaks for Cu and Al is presented in the paper by Williams et al in Acta Metallurgica, Vol. 15, 1967, pages 1111–1118. The low temperature internal friction peak is known to occur only in pure metals and has not generally been observed in alloys, which is an indication that alloying additions suppress grain boundary mobility, as is known to be the case in Al-Cu, for example. The effect of alloying additions upon the high temperature relaxation peak is described in a paper by S. Weinig et al and published in the *Journal of Metals*, Transactions of The AIME, 1957, pages 32–41. It is shown there that alloy addition increases the activation energy, i.e., reduces grain boundary mobility, for the high temperature relaxation peak and that the effect on the activation energy is the greatest for the greater size difference between the alloy addition and the host metal. For host metal Cu, the effect increases for alloying in the order Ni, Si, Ai and Ag. This provides a basis for the selection of alloying additions to reduce or suppress grain boundary mobility in metal in accordance with the principles of this invention.

Illustratively, the elements with suitable properties for practice of this invention, can be selected from the book "Constitution of Binary Alloys," by M. Hansen, McGraw-Hill, Inc., 1958, and Supplements thereto which provide background material on binary phase diagrams and on other physical properties such as the atomic diameters. For example, hardening by an interaction of a vacancy with an impurity occurs when the diameter of the impurity atom relative to that of the matrix atom is different. In the case of dislocations and grain boundaries, such elastic interactions are also important. They are combined with the physical obstruction presented by a hard precipitate. When the impurity element goes into solution in the matrix at an elevated temperature and forms a precipitate at a lower temperature precipitation hardening technique is used whereby a high temperature solid solution is precipitated upon lowering the temperature. For this precipitate to form at grain boundaries, in the practice of this invention, the driving force of precipitation reaction must be effectively small. The solid element should preferably precipitate forming compounds because compounds usually have a high temperature of melting and show accompanying properties such as low diffusion rates and high hardness. These precipitates then effectively tend to block movement of defects such as dislocations.

When the alloy addition does not precipitate out as a compound, it is required for the practice of this invention that the solid element should be harder and have a lower diffusion rate than the matrix of the film. Further, a desirable property of precipitate is that is strains the matrix when formed or nucleated. Such a strain tends to minimize defect movement and favors precipitation at the grain boundaries. Solid elements that favor precipitation at grain boundaries can be selected with reference the lattice parameter of the matrix at the lattice parameter of the precipitate. In order to get a precipitate that generates a strain in the matrix, the lattice parameter differential between the precipitate and the matrix should not be too small. In determining solute elements for the practice of this invention, background information can be obtained from the text "Precipitation Hardening" by A. Kelly et al, *Progress in Material Science*, Vol. 10, Editor, B. Chalmers, Pergamon Press, New York 1963. In the selection of the element for precipitation at grain boundaries, in the practice of this invention, the atomic diameter is required to be different and this is also the condition for the interaction of a vacancy to an impurity. Therefore, a precipitate selected for hardening grain boundaries also tends to slow down movement of vacancies.

Practice of the Invention

Cu is a suitable dopant in Al in accordance with the principles of this invention because of its atomic size difference with aluminum and because of its precipitation hardening properties. Cu has a relatively high binding energy for vacancies in Al and when precipitated it does impede the movement of dislocations and grain boundaries in Al. Mg is also an effective dopant in Al films in accordance with the principles of this invention because it not only has large size difference and precipitation hardening properties, but also has relatively high binding energy for vacancies in Al. Evidence on the large binding energy between Mg atoms and vacancies in Al are presented in a paper by C. Panseri et al, published in *Acta Metallurgica*, Vol. 11, 1963, pages 575–584.

Films 10,000A thick Al were deposited, with and without dopants, on oxidized Si substrates held at 200° C. These films with and without dopants were then annealed at elevated temperatures and the presence of hillocks was examined by optical microscopy. In films doped with Cu and subsequently annealed at 530° C, Cu was shown to reduce the density of the hillocks by a factor of 2 to 5. Similarly, Al films doped with 5% and higher Mg were completely free of hillock growth after annealing at 350° C.

Ag and Au are suitable doping materials for Pb films in accordance with the principles of this invention. Ag and Au are only slightly soluble in Pb at elevated temperatures, and the technique used for making films of Pb doped Au and Ag was coevaporation, that is, the evaporation of either Au or Ag simultaneously with Pb. This technique enables a homogeneous distribution of the dopant in Pb with large amounts of dopant. The amount of dopant that can be incorporated by the precipitation technique, that is, solution at high temperature and then precipitation out at low temperature, is limited by the solid solubility of the dopant in the film. Ag is not soluble in Pb at room temperature and tends to form clusters of essentially pure Ag in an essentially pure Pb film. These Ag clusters are hard relative to Pb and prevent the movement of dislocations. In the case of the Ag in the grain boundaries of Pb, it tends to prevent grain boundary movement. The effect of Au is not only to form Au clusters which are harder than the Pb matrix, but also to form intermetallic compounds with Pb which are harder than the Pb matrix. These compounds are also associated with strain fields which prevents the migration or movement of defects.

With reference to FIG. 2, crucible 2–20 contains Pb and crucible 2–22 contains Au or Ag. The sources are heated with tungsten heating elements 2–21 and 2–23, respectively, in the vacuum of bell jar 2–10. The Au and Pb vapors are collected onto oxidized Si or glass substrates 2–16. The amount of the two metals is controlled by rate monitors 2–28 and 2–30 such as quartz crystal oscillators which change their frequency depending on the thickness or the amount of Pb or Au or Ag deposited on quartz crystals 2–24 and 2–31. By controling these monitors specific amounts of Au or Ag are added to Pb films. It was observed that in films containing Ag, the hillock density after cycling between room temperature and liquid nitrogen temperature several times was minimized and in those cases where Au was co-deposited with Pb, no hillocks were observed.

Miltilayer Technology

Magnetic Device

The use of this invention in multilayer technology will now be explained in connection with a magnetic device which is in accordance with the prior art except for films incorporated therein in accordance with the principles of this invention.

There is shown in FIG. 3 a magnetic device, a device which, for the purposes of illustration only, is limited to a single magnetic film 3–11 supported by a substrate 3–12, e.g., an electrically conductive ground plane, with an insulative layer on the surface thereof. The easy axis of the film 3–11 is indicated by the double-headed arrow as being in the horizontal direction. A first or bit line 3–50 is deposited over the film 3–11 on the substrate or ground plane 3–12 in a direction orthogonal to the easy axis of the film 3–10, and a second or work line 3–52 is also deposited over the film 3–11 on the substrate or ground 3–12 but in a direction parallel to that of the easy axis. The magnetic film 3–11 is illustrated as having a circular shape; but it may have other shapes, such as rectangular, if desired. The bit and word lines 3–50 and 3–52 are preferably strip lines having a width at least as wide as the diameter of the film 3–11 with overlapping portions of the lines 3–50 and 3–52 disposed directly above the flim 3–11. A layer of insulation 3–26, for example silicon monoxide, is interposed between the two lines 3–50 and 3–52; and additional insulating layers 3–20 and 3–24 may be provided on each side of the film 3–11. The bit line 3–52 is connected at one end to a first switching means 3–54 and at the other end to a second switching means 3–56. The first switching means 3–54 is operative to connect the one end of the bit line 3–50 either to a bit driver or generator 3–58 or to ground, while the second switching means 3–56 is operative to connect the other end of the bit line 3–50 either to ground or to a load 3–60 which may be a conventional sense amplifier. The word line 3-52 is connected at one end to a word driver or generator 3-62 and at the other end to the characteristic impedance 3-64 of the word line 3-52. The first and second switching means 3-54 and 3-56 are preferably ganged so that when the one end of bit line 3-50 is connected to the bit driver 3-58 by the first switching means 3-54, the other end of the bit line 3-50 is connected to ground by the second switching means 3-56; and, when the other end of the bit line 3-50 is connected by the second switching means 3-56 to the load 3-60, the one end of the bit line 3-50 is connected by the first switching means 3-54 to ground.

Figure 3A:
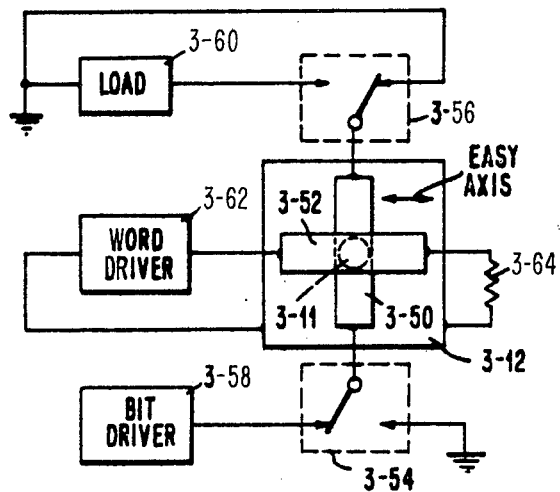
FIGS. 3A and 3B are schematic plan and elevation views of a magnetic information storage device.
Figure 3B:
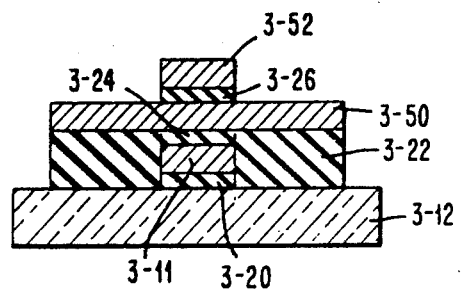

Hillock growth on film 3-11 or on line 3-50 can cause breakdown of insulating layers 3-24 or 3-26, respectively, and may lead to complete failure of the magnetic device of FIGS. 3A and 3B. Therefore, by making one or both of the film 3-11 and conducting line 3-50 in accordance with the principles of this invention, hillock growth is reduced and the yield during production which may involve temperature cycling is increased in the device of FIGS. 3A and 3B. Alternatively, the mechanical stability imparted to the structure in accordance with the principles of this invention permit greater fluxibility during manufacture of devices of FIGS. 3A and 3B.

Superconductor Tunneling Device

The use of this invention in multilayer technology will now be explained in connection with a superconductor tunneling device which is in accordance with the prior art except for films incorporated therein in accordance with the principles of this invention.

Figure 4A:
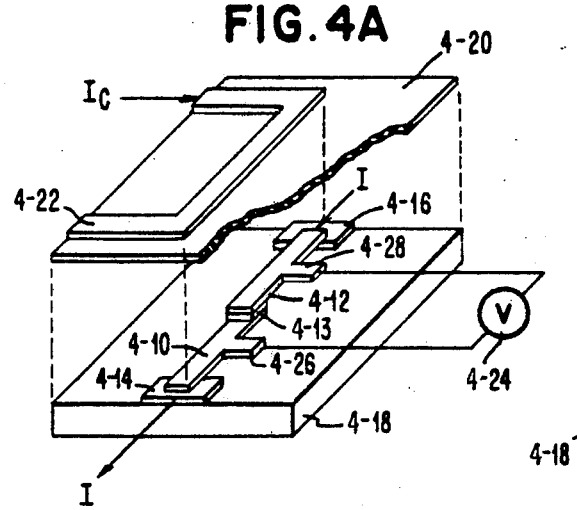
FIG. 4A is a schematic diagram illustrating a tunneling device having an in-line geometry.

FIG. 4A shows a thin film tunneling device having an "in-line" geometry. The device itself comprises two current-carrying layers 4-10, 4-12 which are separated by a tunnel barrier 4-13. Attached to the electrodes 4-10, 4-12 are lead connectors 4-14, 4-16. The entire tunneling device is mounted on the substrate 4-18. Insulated by layer 4-20 from the electrodes 4-10, 4-12 and disposed over these electrodes is a control element 4-22. Although the control element 4-22 is not required, it is shown as a means by which the switching characteristics of the tunneling junction may be controlled. Current, designated by $I_C$, flows through control element 4-22 and sets up a magnetic field which affects the switching characteristics of the tunnel junction. Bias means, such as an external current source, is used to provide tunnel current across the tunnel junction. A meter, such as voltmeter 4-24, can be used to detect voltage changes across the junction. This meter is connected to electrode 4-10 by contact 4-26 and to electrode 4-12 by contact 4-28.

If desired, the tunneling device of FIG. 4A can be a Josephson gate if the tunnel barrier is made very thin, in the order of 2-50 angstroms. By "barrier," it is to be understood that what is meant is the potential barrier through which charge carriers tunnel. This does not necessarily correspond with the physical thickness of the layer 4-13. Preferably, for good Josephson device characteristics, the barrier thickness will be not more than 20 Angstroms. The electrodes are usually 2,000-20,000A thick, but can be as thin as about 500A. If the electrode films become too thin, the superconducting properties, such as critical temperature $T_c$, are affected, and it is then difficult to make reproducibly good devices. In a Josephson device, both electrodes 4-10, 4-12 are superconductors and the electrodes remain in the superconducting state while switching.

The control element 4-22 can be any superconductor, such as lead. As will be more fully apparent later, the electrodes, 4-10, 4-12 can be any superconductor material, including compounds and alloys. Presently known Josephson tunneling devices generally use metals such as Pb, Sn, or In, for the electrodes and thermally grown oxide layers as the barriers. Materials other than oxides can be used as intermediate layers (tunnel barriers). These include nitrides, sulfides, carbides, etc. Although many materials can be used, it is important that the tunnel barrier be of uniform thickness and be free of defects such as pin holes. Various substrate materials can be used. These include quartz, mica, sapphire, metals, and other suitable materials. For instance, a ground plane can be put on the substrate before the devices are fabricated thereon.

Figure 4B:
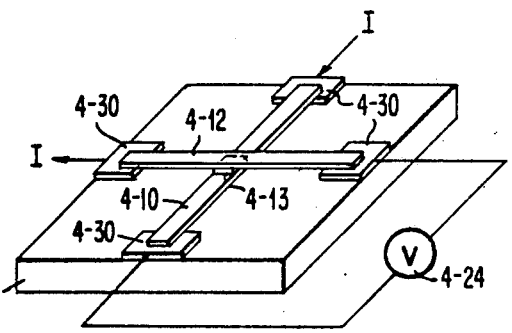
FIG. 4B is a schematic diagram illustrating a tunneling device having a cross-stripe geometry.

FIG. 4B shows a thin film tunneling device according to the present invention, having a cross-stripe geometry. The same reference numerals are used for clarity here as in FIG. 4B. In this geometry, the top electrode 4-12 is arranged transversely to the direction of the bottom electrode 4-10. Electrodes 4-10, 4-12 are separated by a thin barrier layer 4-13 as was the case in the device of FIG. 2A. Connectors 4-30 are provided for connecting external leads to the tunneling device. Current I is provided by an external source not shown. Any conventional source is suitable. A meter, such as voltmeter 4-24, is used to detect voltage changes across the junction, caused by a change in tunnel current across the tunnel junction. The entire tunneling gate is supported by a substrate 4-18. As is the case with the device of FIG. 4A, the same methods of deposition and the same relative dimensions are present in the device of FIG.4B. Although no control element is shown, it is to be understood that one could easily be provided in the manner of that of FIG. 4A.

Figure 4C:
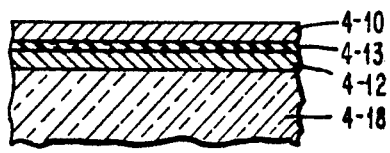
FIG. 4C is a cross-sectional view of the tunneling devices of FIGS. 4A and 4B.

FIG. 4C is a cross sectional view of the tunneling junction of the devices shown in FIGS. 4A and 4B. The tunneling junction is comprised of two current carrying electrodes 4-10, 4-12 separated by a tunnel barrier 4-13. Support is provided by the substrate 4-18. Tunneling current crosses the barrier between the two electrodes. If the barrier is very thin, approximately 2-20 Angstroms, and the electrodes are superconductors, Josephson current can flow. For thicker barriers, conventional tunneling will occur.

It is to be understood that any number of tunneling junctions can be provided in a laminate type structure, and that there can be a series of electrodes separated by tunnel barriers, when more than one tunneling junction is desired.

Figure 4D:
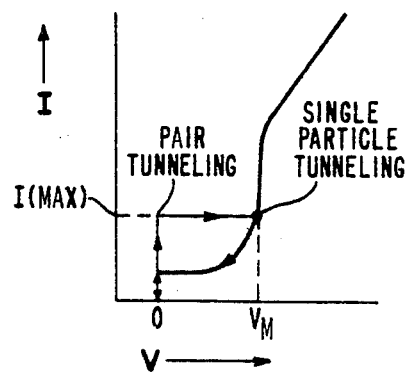
FIG. 4D is a current versus voltage diagram for a Josephson tunneling device.

FIG. 4D is a current versus voltage diagram for the tunneling devices shown in FIGS. 4A, 4B, and 4C. In particular, both Josephson current (pair tunneling) and conventional (single particle) tunneling are illustrated here.

The Josephson gate comprises two superconducting electrodes separated by a tunneling barrier, and is characterized by having two tunneling states to which the device can be switched. One of these states is a pair tunneling state in which current will flow through the barrier region (Josephson junction) without a voltage drop. The other state is a single particle tunneling state in which current flows with a voltage $E_g/e$ when both superconductors are all the same, and where $E_g$ is the energy gap of the superconductors and e is the electron charge. The transition from one state to the other can be accomplished by exceeding the critical current for the Josephson junction. This in turn can be brought about by a gate or control pulse of appropriate magnitude.

At no time is there a superconducting-to-normal phase transition in the electrodes of a Josephson device. There is a phase transition in the Josephson device, but it is of a peculiar nature and takes place in a very small volume, i.e., in the barrier. Because the superconducting-to-normal phase transition does not include the relatively large electrodes, which remain superconducting, and because the active region of the device is very small, the transition time to full voltage is very short. The tunnel barrier in a Josephson device can be a metal, or insulator, or even a vacuum. Two superconductors in close proximity can give rise to Josephson current between them. Even "constriction-type" Josephson devices (weak superconducting link) in which a single superconducting sheet has a narrow portion can be used to produce Josephson tunneling current.

With reference to FIG. 4D, if there is no Josephson current (zero-voltage current), the I-V curve is that which is represented by a line starting from the origin and proceeding to a voltage $V_M$, after which the curve from voltage $V_M$ is followed. If there is Josephson current, then the curves containing a zero-voltage current are applicable.

If the barrier layer is very thin, Josephson current can exist across the junction. This flow of supercurrent produces no voltage across the junction. That is, there is an initial current increase from zero but no increase in junction voltage. The junction can carry only a limited supercurrent $I_{max}$ and above this critical current the junction switches abruptly to the usual current-voltage characteristic with a corresponding abrupt increase in voltage across the junction to approximately $V_1$.

The transition from a voltage of approximately $V_M$ to zero voltage for decreasing current occurs at a current that is somewhat less than $I_{max}$, producing a hysteresis effect. This lower current is designated $I_{min}$. The direction of the arrows indicates the behavior of the junction when there is Josephson current. That is, at zero voltage there is a current $I_{max}$ and then the voltage increases to approximately $V_M$ when the critical current is exceeded. The curve is then followed to a certain point, at which the junction switches to Josephson tunneling and the current $I_{min}$ flows across the junction.

The maximum Josephson current, $I_{max}$, is related to leakage, oxide uniformity, and the area through which pairs are tunneling. Trapped flux occurs around hillocks which grow through the barrier. This trapped flux limits $I_{max}$. These factors also lead to poor I-V characteristics.

The switching voltage $V_m$ is a function of the squareness of the switching loop and depends upon discreteness of energy gap, leakage paths, and orientation of the crystals. If the switching characteristic is very square then the difference in voltage from one stable state to the other is greater, and the device is better suited for many applications. In operation, two voltage states are detected, i.e., the zero voltage state (at which Josephson current exists) and the voltage $V_m$ (at which single particle tunneling occurs).

With reference to FIGS. 4A, 4B and 4C, the usefulness of the device is determined by its tunnel barrier 4–13. If an electrical short develops between the layers 4–10 and 4–12 through the barrier 4–13, the tunneling characteristics of the device are impaired or even destroyed. The stability of the device to thermal cycling is determined by the extent to which the structure in layers 4–10 and 4–12 can be stabilized with respect to mechanical stress introduced during the thermal cycling. The principles of this invention provide a solution to this problem by the addition of selected alloying elements to layers 4–10 and 4–12 during fabrication thereof.

Semiconductor Device

The use of this invention in multilayer technology will now be explained in connection with a semiconductor device which is in accordance with the prior art except for films incorporated therein in accordance with the principles of this invention.

Figure 5A:
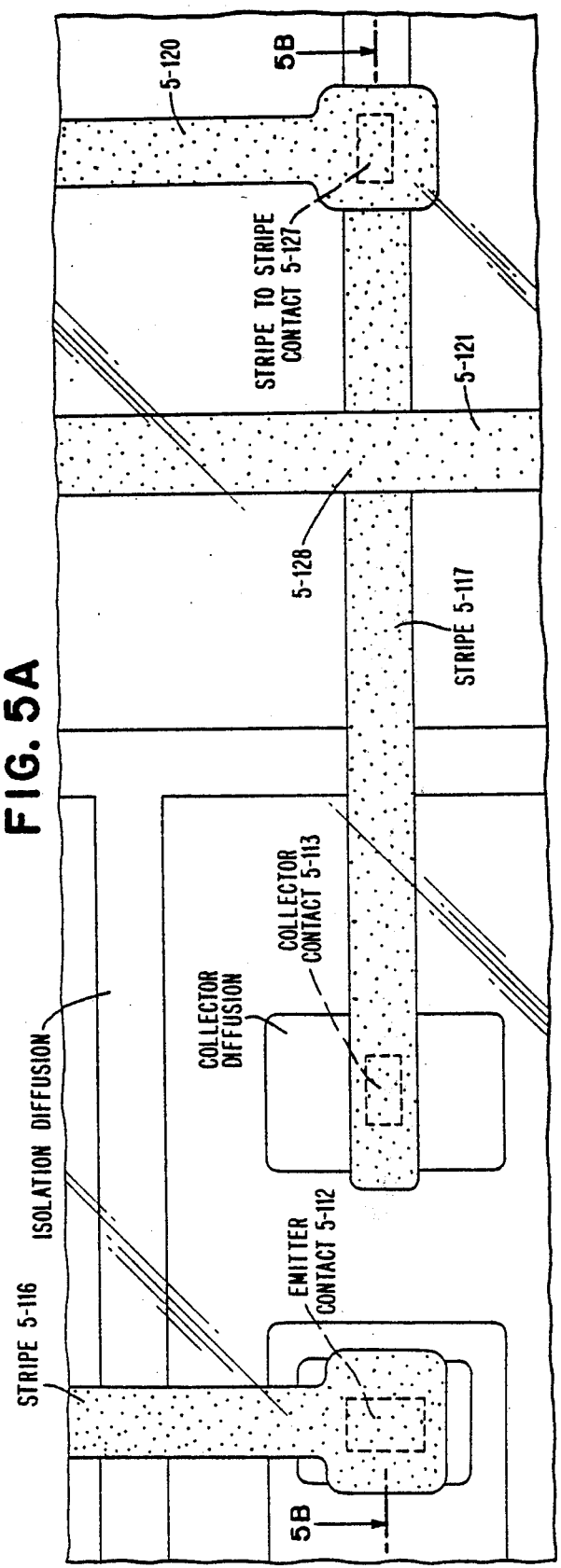
FIGS. 5A and 5B are schematic plan and elevation view of a semiconductor device including metallic interconnection and insulating layers.
Figure 5B:
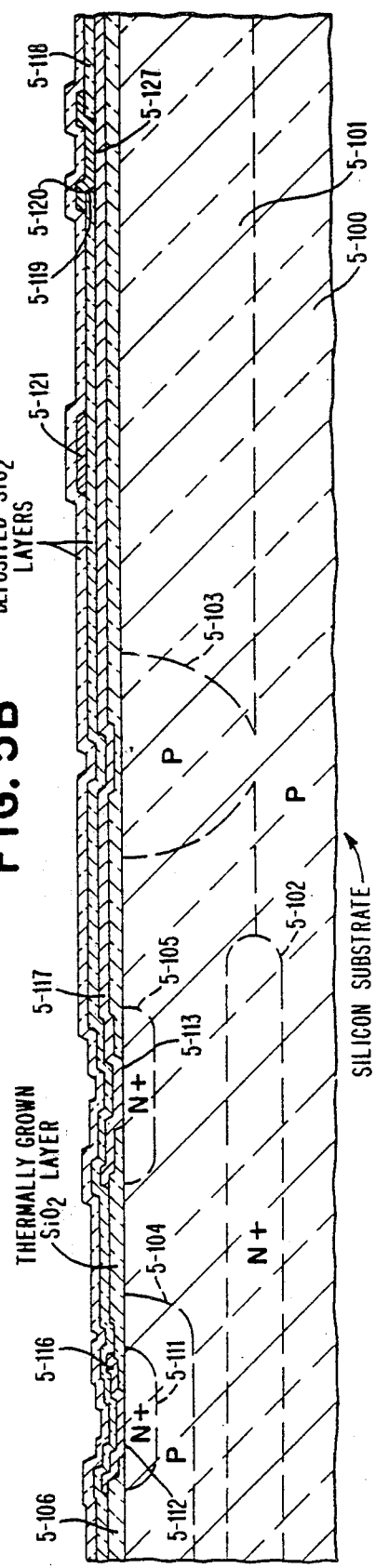

The integrated circuit semiconductor structure depicted in FIGS. 5A and 5B contains two levels of interconnecting metallization. It is formed by starting with a silicon substrate and performing epitaxial deposition, diffusion and oxidation steps on the substrate in accordance with state-of-the art procedures. The particular type of circuit shown contains a p-type substrate 5-100 onto which has been deposited an n-type epitaxial layer 5-101 and into which has been diffused (by outdiffusion from the p-type substrate 5-100) a "buried" $n^+$-type layer 5-102, (prior to epitaxy) a p-type isolation diffusion 5-103, a p-type base diffusion 5-104 and an $n^+$- (emitter) diffusion 5-111 or collector contact diffusion 5-105. Oxide growth and re-growth together with photoprocessing steps result in formation of a contoured, thermally-grown $SiO_2$ layer 5-106. Insulating layer 5-106 can also be formed in whole or in part with silicon nitride, alumina, etc. Prior to deposition of the first layer of metallization, contact holes are opened in that layer as indicated by the location of the metallization in contrast with surface portions of the integrated semiconductor structure. A bipolar transistor consists of base 5-104, emitter 5-111 and collectors 5-101, 5-102, and 5-105. Contact hole 5-112 is for access to the $n^+$-type emitter 5-111. Contact hole 5-113 is for access to the upper $n^+$-type collector contact portion 5-105 of the collector. Overlying the thermally-grown $SiO_2$ layer 5-106 and the indicated contacts is the first metallization layer in segments 5-114, 5-115, 5-116 and 5-117, each formed from the same parent metallization layer through the use of photoprocessing techniques.

Above the first metallization layer is the first deposited insulating layer 5-118 which is preferably of silicon dioxide but can also be formed in whole or in part of silicon nitride, alumina, etc., deposited, for example, through the use of radio-frequency sputtering techniques. The layer contains via hole 5-119 for permitting access between the first metallization layer and an overlying metallization layer, which contains segments 5-120 and 5-121, which are formed by use of photoprocessing techniques. The segment 5-121 crosses over the segment 5-117 and is electrically insulated from it by means of the insulating layer 5-118. The segment 5-120 makes electrical contact to the segment 5-117 through the via hole 5-119. The overlying $SiO_2$ layer 5-122 serves primarily as a protective coating (for the underlying layers and semiconductor substrate) against atmospheric chemical attack or corrosion. Hillocks growing on stripe 5-117 during deposition of insulating layer 5-118 may cause shorts to the subsequently deposited metallic stripe 5-128. Hillocks growing on stripes 5-128 during deposition (usually at relatively high temperatures) of protective stripe 5-130 may destroy the protecting properties thereof and lead to subsequent failure of the whole device. It is in accordance with the principles of this invention that fabrication of stripes 5-117 and 5-128 according to its teaching will minimize or prevent such causes of failure.

Examples of the Invention

Thin films deposited on substrates undergo varying stresses with varying temperature because of differential thermal expansion between the film and the substrate. In most metal substrate combinations, the metal has the larger coefficient of thermal expansion, and as a result, biaxial compressive stresses are set up when the film-substrate composite is heated to elevated temperatures.

One of the ways by which the film tends to relieve such stress is by growing "hillocks" or small protrusions on the film surface. In accordance with the principles of this invention, alloying elements are added to the film so that they affect defect movements and the phenomenon of hillock formation is thereby controlled.

Al Films Doped With Cu or Mg

Illustratively, 10,000A thick Aluminum films were deposited at 200° C on thermally oxidized Si substrates, with and without dopants. The alloyed films were deposited in a sandwich type structure, in such a way that a deposition of 5,000A of Al was followed by a deposit of Copper (Cu) or Magnesium (Mg) in the desired amount, and finally followed by a deposition of 5000A of Al. Vacuum was not broken between the depositions which took place under a pressure of $1-2\times10^{-7}$ Torr. Because of these conditions, considerable diffusion of Cu and Mg into the aluminum occurred during the deposition at 200° C. These films were then annealed at elevated temperatures and the hillocks were examined by optical microscopy.

Cu has a large atomic size difference compared with Al and has desirable precipitation hardening properties therewith. Quantitative measurements indicated that the typical hillock density in annealed undoped Al film is about $3-5 \times 10^6$/sq.cm whereas in doped films, the density was $1-2 \times 10^6$/sq.cm. Cu doping, therefore, decreased the hillock density by a factor of 2 to 5.

Mg in addition to having a large atomic size difference compared with Al and desirable precipitation hardening properties also has a high binding energy for vacancies in aluminum. Addition of 5% or more Mg to Al films completely eliminates all hillocks. Further, it was determined that 3% Mg in conjunction with 3% Cu also eliminated all hillocks in Al films.

Pb Films Doped With Ag or Au

Films of Lead (Pb) with a nominal thickness between 2,000A and 3,000A were prepared by evaporation of Pb in a vacuum system. The Pb films were evaporated from a Pb source using a tungsten heating source. The Pb vapor was deposited on a substrate (oxidized Si or glass) which was maintained at room temperature. The vacuum during deposition was $10^{-6}$ Torr. After deposition was completed, the Pb films were examined in an optical microscope and observed to have a smooth shiny surface. These films were now cooled to liquid nitrogen temperature in a vacuum and then warmed to room temperature. This temperature cycle was repeated several times. After cycling the films were examined in the microscope and it was observed that the surface contained small protrusions on the surface. These protrusions are termed hillocks.

In order to minimize the density of such hillocks the Pb films were "doped" (or alloyed) with Silver (Ag) or Gold (Au). This was carried out as follows: two sources containing Ag or Au and Pb were heated in vacuum and the vapors of the two were simultaneously deposited on the substrate forming a Pb-Ag film or a Pb-Au film. These films deposited at room temperature were temperature-cycled several times. It was observed that the density of hillocks was minimized. Au was found to be more effective than Ag. The weight percent of Ag or Au was 7% to 10%. The amount of the two components of the film was maintained during evaporation using quartz crystal oscillators whose frequency changes as deposition occurs. The change in frequency is proportional to the amount of the deposit.

Simultaneous coevaporation was carried out to obtain alloying at room temperature. The solubility of Ag in Pb at room temperature is very restricted, e.g., Hansen: Constitution of Binary Alloys, McGraw-Hill Book Co., 1958, page 40, and the normal precipitation techniques have only limited or negligible usefulness. Coevaporation is desirably used to achieve the desired amount of Ag dopant into the Pb film.

Further, Au and Pb have very restricted solubility in each other and an appreciable amount of Au is distributed in Pb film by coevaporation.

I claim:

1. A tunnel device exhibiting Josephson tunnelling current, comprising:
    a base first film electrode comprised of a first lead superconducting material and a substantially homogeneous distribution of alloying additions present throughout said superconducting material selected from the group of elements consisting of gold and silver in the range of approximately 7 to 10 percent by weight of said superconducting material;
    a tunnel barrier in contact with said first superconducting material comprised of an oxide and being sufficiently thin that Josephson current can tunnel therethrough; and
    a counter second film electrode in contact with said tunnel barrier comprised of a second lead superconducting material.

2. The device of claim 1 wherein said alloying additions in said lead superconducting material of said first electrode are comprised of gold.

3. The device of claim 1 wherein said alloying additions in said lead superconducting material of said first electrode are comprised of silver.

4. The device of claim 1 wherein there is a substantially homogeneous distribution of alloying additions present throughout said second superconducting material selected from the group of elements consisting of gold and silver in the range of approximately 7 to 10 percent by weight of said second superconducting material.

5. The device of claim 1 in which said first electrode is formed by a process including the codeposition of said first lead superconducting material and said alloying additions selected from the group of elements consisting of gold and silver.

6. A tunnel device exhibiting Josephson tunnelling current, comprising:
- a base first film electrode comprised of a first lead superconducting material and a substantially homogeneous distribution of alloying additions present in said superconducting material selected from the group of elements consisting of gold and silver in the range of approximately 7 to 10 percent by weight of said superconducting material;
- said first electrode is being formed by a process including the codeposition of said first lead superconducting material and said alloying additions selected from the group of elements consisting of gold and silver;
- a tunnel barrier in contact with said first superconducting material comprised of an oxide and being sufficiently thin that Josephson current can tunnel therethrough; and
- a counter second film electrode in contact with said tunnel barrier comprised of a second lead superconducting material.

7. A tunnel device exhibiting Josephson tunneling current, comprising:
- a substrate,
- a base electrode on said substrate with a different thermal coefficient of expansion in a given temperature range than said substrate, said electrode being comprised of a first lead superconducting material and a substantially homogeneous distribution of at least one alloying addition present throughout said superconducting material in an amount sufficient to prevent movement of substantially all of the defects present in said base electrode which contribute to hillock formation thereon when said tunnel device is thermally cycled in said temperature range, said alloying additions being selected from the group of elements consisting of gold and silver,
- a tunnel barrier in contact with said first superconducting material comprised of an insulating layer and being sufficiently thin that Josephson current can tunnel therethrough, and
- a counter electrode in contact with said tunnel barrier, said counter electrode being comprised of a second lead superconducting material, wherein said alloying additions prevent substantial hillock formation on the surface of said base electrode at said tunnel barrier when said tunnel device is thermally cycled in said temperature range.

* * * * *